US010338181B2

United States Patent
Kim et al.

(10) Patent No.: US 10,338,181 B2
(45) Date of Patent: Jul. 2, 2019

(54) RADIO FREQUENCY COIL ASSEMBLY FOR MAGNETIC RESONANCE IMAGING AND MAGNETIC RESONANCE IMAGING SYSTEM

(71) Applicant: Samsung Electronics Co., Ltd., Suwon-si (KR)

(72) Inventors: Kyoung-nam Kim, Gunpo-si (KR); Jung-hee Lee, Seoul (KR); Geun-ho Im, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 197 days.

(21) Appl. No.: 15/112,570

(22) PCT Filed: Jul. 15, 2014

(86) PCT No.: PCT/KR2014/006370
§ 371 (c)(1),
(2) Date: Jul. 19, 2016

(87) PCT Pub. No.: WO2015/122583
PCT Pub. Date: Aug. 20, 2015

(65) Prior Publication Data
US 2016/0341809 A1 Nov. 24, 2016

(30) Foreign Application Priority Data
Feb. 17, 2014 (KR) .................. 10-2014-0018040

(51) Int. Cl.
*G01R 33/34* (2006.01)
*G01R 33/565* (2006.01)
*G01R 33/341* (2006.01)

(52) U.S. Cl.
CPC ......... *G01R 33/5659* (2013.01); *G01R 33/34* (2013.01); *G01R 33/341* (2013.01)

(58) Field of Classification Search
None
See application file for complete search history.

(56) References Cited

U.S. PATENT DOCUMENTS

| 4,825,162 A * | 4/1989 | Roemer | G01R 33/3415 324/312 |
| 5,808,467 A * | 9/1998 | Ochi | G01R 33/3415 324/309 |

(Continued)

FOREIGN PATENT DOCUMENTS

| JP | 2000-166893 A | 6/2000 |
| JP | 2008-212449 A | 9/2008 |

OTHER PUBLICATIONS

International Search Report dated Nov. 17, 2014 in counterpart International Application No. PCT/KR2014/006370 (3 pages).

*Primary Examiner* — Melissa J Koval
*Assistant Examiner* — Nasima Monsur
(74) *Attorney, Agent, or Firm* — NSIP Law

(57) ABSTRACT

A radio frequency (RF) coil assembly for magnetic resonance imaging includes a transmit only (Tx only) RF coil to apply an RF signal to an object, and a receive only (Rx only) RF coil to receive a magnetic resonance signal from a region of interest of the object excited by the applied RF signal. The Tx only RF coil and the Rx only RF coil are disposed such that a first center of the Tx only RF coil and a second center of the Rx only RF coil are spaced apart from each other by a distance identical to a distance between a first peak point of a first magnetic field generated by the Tx only RF coil and a second peak point of a second magnetic field generated by the Rx only RF coil.

20 Claims, 11 Drawing Sheets

(56) References Cited

U.S. PATENT DOCUMENTS

| | | |
|---|---|---|
| 5,969,527 A | 10/1999 | Slade |
| 6,946,840 B1 | 9/2005 | Zou et al. |
| 2003/0095022 A1* | 5/2003 | Boynton .................. A61N 2/02 335/299 |
| 2003/0114748 A1* | 6/2003 | Su ...................... G01R 33/3415 600/422 |
| 2009/0134873 A1 | 5/2009 | Cho et al. |
| 2009/0174408 A1 | 7/2009 | Wang et al. |
| 2010/0253348 A1* | 10/2010 | Wiggins ........... G01R 33/34046 324/318 |
| 2012/0319646 A1* | 12/2012 | Kamata .................. H02J 7/025 320/108 |

* cited by examiner

RADIO FREQUENCY COIL ASSEMBLY FOR MAGNETIC RESONANCE IMAGING AND MAGNETIC RESONANCE IMAGING SYSTEM

CROSS-REFERENCE TO RELATED APPLICATIONS

This application is a U.S. National Stage Application of International Application No. PCT/KR2014/006370, filed on Jul. 15, 2014, which claims the benefit under 35 USC 119(a) and 365(b) of Korean Patent Application No. 10-2014-0018040, filed on Feb. 17, 2014, in the Korean Intellectual Property Office.

TECHNICAL FIELD

The present disclosure relates to radio frequency (RF) coil assemblies for magnetic resonance imaging and magnetic resonance imaging systems.

BACKGROUND ART

Magnetic resonance imaging (MRI) apparatuses, magnetic resonance spectroscopy (MRS) apparatuses, and the like have been known as magnetic resonance systems using a nuclear magnetic resonance (NMR) phenomenon.

An MRI apparatus acquires a cross-sectional image of a human body by using the NMR phenomenon. Since nuclei of hydrogen (1H), phosphorus (31P), sodium (23Na), carbon isotope (13C), and the like constituting the human body respectively have a unique constant of rotating magnetic field by the NMR phenomenon, a cross-sectional image of the human body may be acquired by applying high frequency signals to a magnetization vector of each of the nuclei aligned in a direction of a main magnetic field by using a radio frequency (RF) coil, and receiving magnetic resonance signals, which are generated when the magnetization vectors of the nuclei are re-aligned in a direction perpendicular to a longitudinal plane by frequency resonance, by using the RF coil.

The RF coil may include an RF antenna that transmits high frequency signals to cause the magnetization vectors to resonate and to receive the magnetic resonance signals. Both of the resonating the magnetization vectors (RF transmission mode) and receiving the magnetic resonance signals (RF reception mode) may be performed by a single RF coil (RF antenna). Alternatively, an RF coil may be used only for the RF transmission mode and another RF coil may be used only for the RF reception mode. An RF coil performing the RF transmission mode and the RF reception mode is referred to as a Tx/Rx coil. An RF coil performing the transmission mode only is referred to as a Tx coil, and an RF coil performing the reception mode only is referred to as an Rx coil. Most of the Tx coils are installed inside a main magnet and have a circular shape into which the human body is moved or a birdcage shape formed on a circular frame. On the contrary, the Rx coil is generally disposed adjacent to the human body and has various shapes in accordance with the shape of a portion of the human body.

DISCLOSURE

Technical Problem

Provided are radio frequency (RF) coil assemblies for magnetic resonance imaging and magnetic resonance imaging systems.

Additional aspects will be set forth in part in the description which follows and, in part, will be apparent from the description, or may be learned by practice of the presented embodiments.

Technical Solution

According to an aspect of the present invention, a radio frequency (RF) coil assembly for magnetic resonance imaging includes: a transmit only (Tx only) RF coil which applies an RF signal to an object; and a receive only (Rx only) RF coil which receives a magnetic resonance signal from a region of interest of the object excited by the applied RF signal, wherein the Tx only RF coil and the Rx only RF coil are disposed such that a first center of the Tx only RF coil and a second center of the Rx only RF coil are spaced apart from each other by a distance identical to a distance between a first peak point of a first magnetic field generated by the Tx only RF coil and a second peak point of a second magnetic field generated by the Rx only RF coil.

The first peak point may be a point where an intensity of the first magnetic field is highest, the second peak point may be a point where an intensity of the second magnetic field is highest, and the first peak point and the second peak point may be equal in height with respect to a common plane.

The distance between the first center and the second center may be proportional to the distance between the first peak point and the second peak point.

The distance between the first center and the second center may depend on at least one of a size of the Tx only RF coil, a size of the Rx only RF coil, and a size of the region of interest.

The Tx only RF coil and the Rx only RF coil may be disposed to two-dimensionally overlap each other.

The Tx only RF coil and the Rx only RF coil may be single-channel or multi-channel RF coils.

The Tx only RF coil and the Rx only RF coil may be circular RF coils or polygonal coils having N sides, wherein N is a natural number of 3 or greater.

The first magnetic field may be a B1+ magnetic field, and the second magnetic field may be a B1− magnetic field.

The Tx only RF coil and the Rx only RF coil may be driven in a magnetic resonance imaging system at a magnetic flux density of 7 tesla (T) or greater.

According to another aspect of the present invention, a magnetic resonance imaging system includes: an radio frequency (RF) coil assembly including a transmit only (Tx only) RF coil which applies an RF signal to an object and a receive only (Rx only) RF coil which receives a magnetic resonance signal from a region of interest of the object excited by the applied RF signal; an RF coil controller which controls an RF transmission mode of the Tx only RF coil and an RF reception mode of the Rx only RF coil; and an image processor which generates a magnetic resonance image of the object based on the received magnetic resonance signal, wherein the Tx only RF coil and the Rx only RF coil are disposed such that a first center of the Tx only RF coil and a second center of the Rx only RF coil are spaced apart from each other by a distance identical to a distance between a first peak point of a first magnetic field generated by the Tx only RF coil and a second peak point of a second magnetic field generated by the Rx only RF coil.

The first peak point may be a point where an intensity of the first magnetic field is highest, the second peak point may be a point where an intensity of the second magnetic field is highest, and the first peak point and the second peak point may be equal in height with respect to a common plane.

The distance between the first center and the second center may be proportional to the distance between the first peak point and the second peak point.

The distance between the first center and the second center may depend on at least one of a size of the Tx only RF coil, a size of the Rx only RF coil, and a size of the region of interest of the object.

The Tx only RF coil and the Rx only RF coil may be disposed to two-dimensionally overlap each other.

The Tx only RF coil and the Rx only RF coil may be single-channel or multi-channel RF coils.

The Tx only RF coil and the Rx only RF coil may be circular RF coils or polygonal coils having N sides, wherein N is a natural number of 3 or greater.

The first magnetic field may correspond to a B1+ magnetic field, and the second magnetic field may correspond to a B1− magnetic field.

The magnetic resonance imaging system may be driven at a magnetic flux density of 7 tesla (T) or greater.

Advantageous Effects

As described above, according to the one or more of the above embodiments of the present invention, the Tx only RF coil and the Rx only RF coil are physically and spatially separate from each other, and thus the peak point of the B1+ magnetic field generated by the Tx only RF coil is disposed at a location identical to that of the peak point of the B1− magnetic field generated by the Rx only RF coil. Thus, homogeneity of the B1 magnetic field may be improved and an accurate magnetic resonance image may be acquired.

DESCRIPTION OF DRAWINGS

These and/or other aspects will become apparent and more readily appreciated from the following description of the embodiments, taken in conjunction with the accompanying drawings in which.

BEST MODE

Figure 1A:
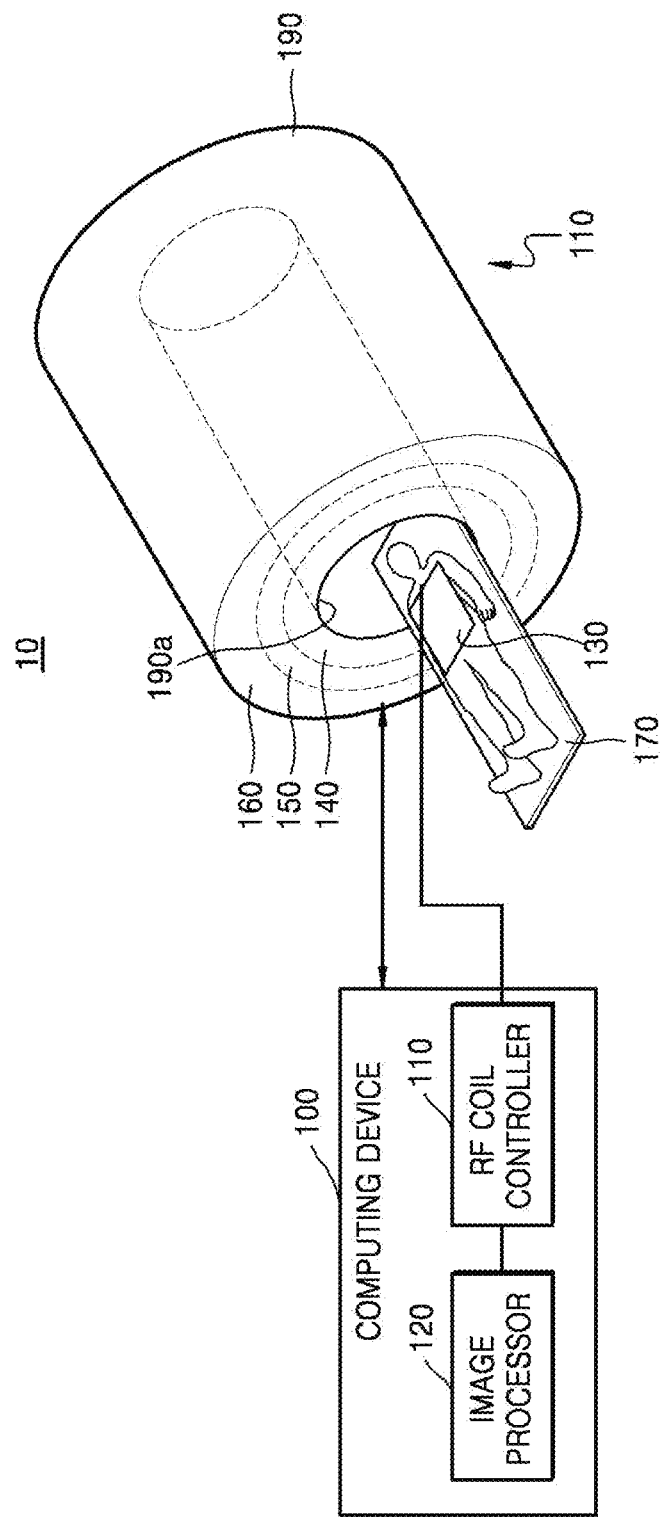
FIGS. 1A and 1B are diagrams illustrating magnetic resonance imaging systems according to an embodiment of the present invention.

According to an aspect of the present invention, a radio frequency (RF) coil assembly for magnetic resonance imaging includes: a transmit only (Tx only) RF coil which applies an RF signal to an object; and a receive only (Rx only) RF coil which receives a magnetic resonance signal from a region of interest of the object excited by the applied RF signal, wherein the Tx only RF coil and the Rx only RF coil are disposed such that a first center of the Tx only RF coil and a second center of the Rx only RF coil are spaced apart from each other by a distance identical to a distance between a first peak point of a first magnetic field generated by the Tx only RF coil and a second peak point of a second magnetic field generated by the Rx only RF coil.

According to another aspect of the present invention, a magnetic resonance imaging system includes: an radio frequency (RF) coil assembly including a transmit only (Tx only) RF coil which applies an RF signal to an object and a receive only (Rx only) RF coil which receives a magnetic resonance signal from a region of interest of the object excited by the applied RF signal; an RF coil controller which controls an RF transmission mode of the Tx only RF coil and an RF reception mode of the Rx only RF coil; and an image processor which generates a magnetic resonance image of the object based on the received magnetic resonance signal, wherein the Tx only RF coil and the Rx only RF coil are disposed such that a first center of the Tx only RF coil and a second center of the Rx only RF coil are spaced apart from each other by a distance identical to a distance between a first peak point of a first magnetic field generated by the Tx only RF coil and a second peak point of a second magnetic field generated by the Rx only RF coil.

Mode for Invention

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein.

Accordingly, the embodiments are merely described below, by referring to the figures, to explain aspects of the present description. Expressions such as "at least one of," when preceding a list of elements, modify the entire list of elements and do not modify the individual elements of the list.

Figure 1B:
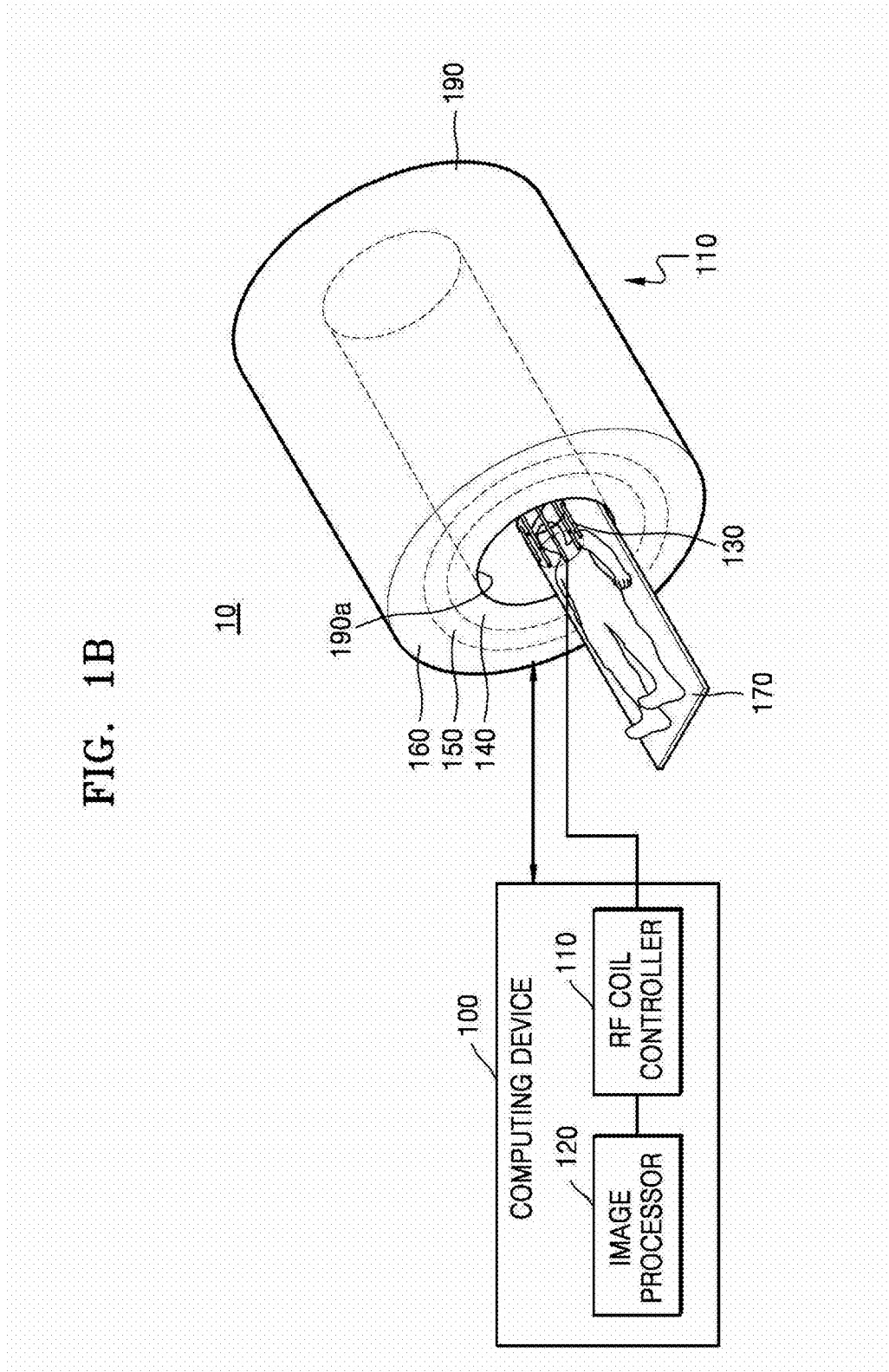

FIGS. 1A and 1B are diagrams illustrating magnetic resonance imaging systems 10 according to an embodiment of the present invention.

Since elements of the magnetic resonance imaging systems 10 of FIGS. 1A and 1B are the same as one another except for a planar radio frequency (RF) coil assembly 130 illustrated in FIG. 1A and a circular RF coil assembly 130 illustrated in FIG. 1B, FIGS. 1A and 1B will be described in association with each other.

Referring to FIGS. 1A and 1B, a magnetic resonance imaging system 10 includes a computing device 100 and a circular housing 190.

The circular housing 190 includes a transmit only (Tx only) volume RF coil device 140, a gradient magnetic field coil 150, and a main magnet 160 disposed in an outward direction from the inside. An object in a state of lying down on a table 170 is moved into a bore 190a of the circular housing 190. Then, a magnetic resonance imaging process is performed.

In the magnetic resonance imaging system 10, the Tx only volume RF coil device 140, the gradient magnetic field coil 150, and the main magnet 160, which constitute the circular housing 190, may be driven and controlled while in a state of being connected to the computing device 100. The computing device 100 may also be connected to a console (not shown) for displaying a magnetic resonance image of an object or receiving a manipulation signal input from a user.

In the magnetic resonance imaging system 10, the Tx only volume RF coil device 140 may independently be driven and controlled by an RF coil controller 110 of the computing device 100 together with the planar RF coil assembly 130 of FIG. 1A or the circular RF coil assembly 130 of FIG. 1B disposed at an inspection area of the object.

The main magnet 160 generates a main magnetic field to magnetize nuclei of elements which induce a magnetic resonance phenomenon, from among the elements distributed in the human body, i.e., hydrogen, phosphorus, sodium, and carbon. The main magnet 160 may be a superconductive electromagnet or a permanent magnet.

The gradient magnetic field coil 150 is a coil that generates a spatially linear gradient magnetic field to acquire a magnetic resonance image. In general, three gradient magnetic field coils respectively generating gradient magnetic fields in x-, y-, and z-directions are used in a magnetic resonance imaging process. The gradient magnetic field coil 150 spatially controls a rotation frequency or a phase of a magnetization vector while the magnetization vector rotates in a transverse plane, so as to express a magnetic resonance image signal in a spatial frequency domain, i.e., k-space.

In order to generate the magnetic resonance image signal, the magnetization vectors need to be aligned in a direction perpendicular to a transverse plane. To this end, the volume RF coil device 140, and the RF coil assembly 130 are required to generate an RF magnetic field using Larmor frequency as a center frequency. The volume RF coil device 140 and the RF coil assembly 130 to which RF current of a Larmor frequency band is supplied generate a rotating magnetic field that rotates at the Larmor frequency. When resonance of the magnetization vector, i.e., nuclear magnetic resonance, is induced by the rotating magnetic field, the magnetization vector is aligned in the transverse plane. When the magnetization vector is aligned in a direction perpendicular to the transverse plane, the magnetization vector rotating at the Larmor frequency in the transverse plane induces electromotive force in the volume RF coil device 140 and the RF coil assembly 130 by Faraday's law. The electromotive force signal, i.e., the received RF signal, is amplified by using a high frequency amplifier and the amplified signal is demodulated into a sine wave, thereby obtaining a magnetic resonance signal of a baseband. The magnetic resonance signal of the baseband is transmitted to the computing device 100, and processed, for example, quantized, by an image processor 120, thereby generating a magnetic resonance image.

A general principle of generating a magnetic resonance image by the magnetic resonance imaging system 10 is briefly described. Detailed descriptions of generating a magnetic resonance image which would be obvious to one of ordinary skill in the art will not be given herein.

In the magnetic resonance imaging system 10, the volume RF coil device 140 of the circular housing 190 may be used to acquire a magnetic resonance image of the entire body of the object. Alternatively, the RF coil assembly 130 disposed at a portion of the body of the object may be used to acquire a local magnetic resonance image of the portion of the body of the object, for example, head, chest, or leg. The RF coil assembly 130 is a separate and independent device disposed outside the circular housing 190 and is a moveable device which may be positioned at a portion of the body of the object subjected to magnetic resonance imaging.

Conventional RF coils disposed at a portion of the body of the object may include a birdcage coil, a saddle coil, a transverse electromagnetic (TEM) coil, a receive-only surface coil, and the like. However, the RF coil assembly 130 according to the embodiment of the present invention has a different structure from these conventional RF coils.

Although FIG. 1A illustrates the planar RF coil assembly 130, and FIG. 1B illustrates the circular RF coil assembly 130 different from that of FIG. 1A, as described above, functions and roles of the RF coil assemblies 130 of FIGS. 1A and 1B are the same.

Meanwhile, signals having various resonating frequencies may be applied to the magnetic resonance imaging system 10. When the magnetic resonance imaging system 10 is operated at magnetic flux densities of 3 tesla (T), 4.7 T, 7 T, and 9.4 T, operating frequencies will respectively be 127.74 MHz, 200 MHz, 300 MHz, and 400 MHz.

However, when the magnetic resonance imaging system 10 is operated at an ultra-high magnetic field having a magnetic flux density of 7 T or greater, and the RF coil assembly 130 includes a single RF coil functioning as a transmit and receive (Tx/Rx) RF coil, homogeneity of a B1 magnetic field generated by the Tx/Rx RF coil may decrease.

Thus, in the magnetic resonance imaging system 10 according to the present embodiment, the RF coil assembly 130 separately includes the Tx only RF coil and the Rx only coil, so that homogeneity of the B1 magnetic field generated by the RF coil assembly 130 may be improved even in an ultra-high magnetic field of 7 T or greater. This will be described in more detail with reference to the drawings.

Figure 2:
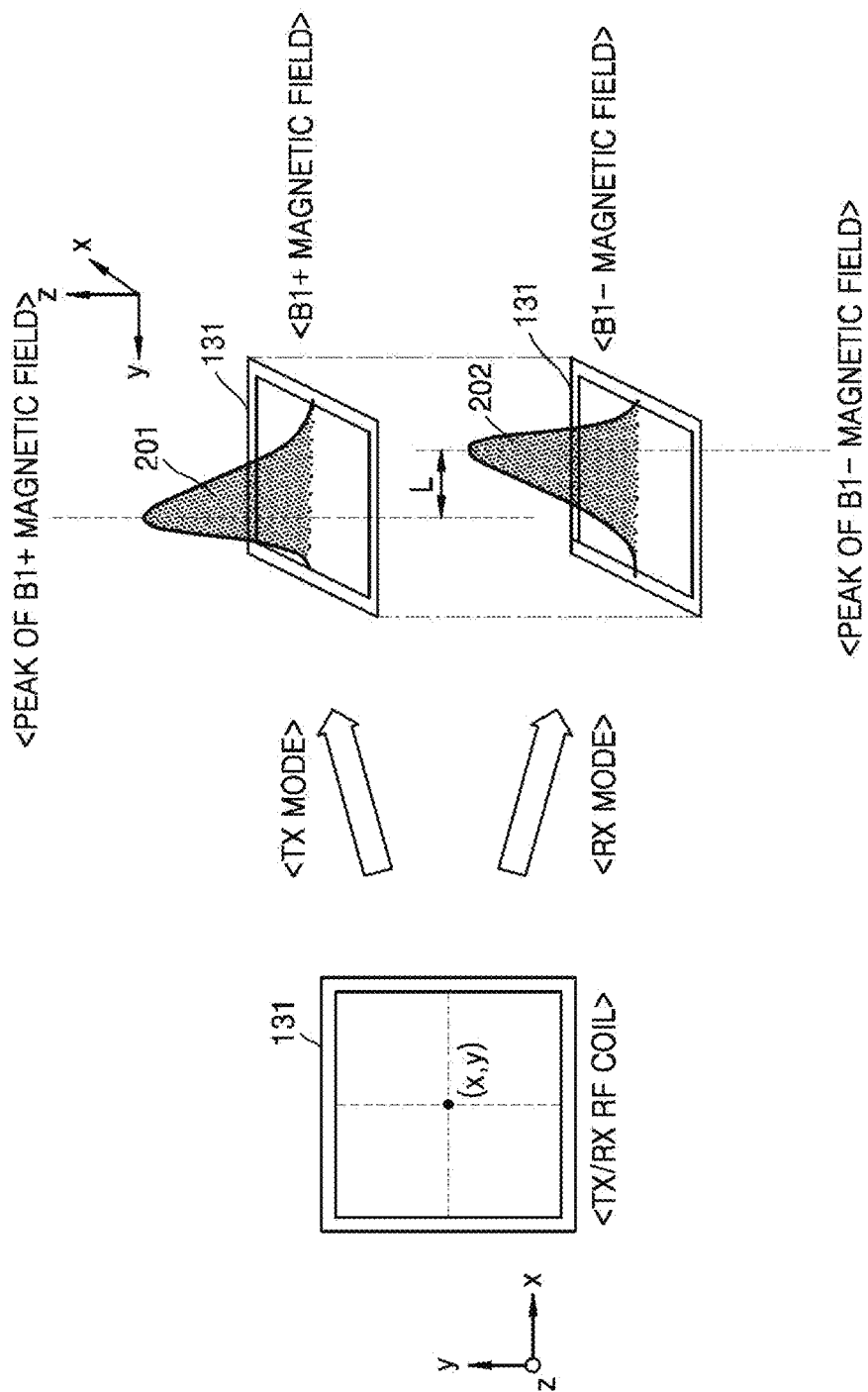
FIG. 2 is a diagram for describing inhomogeneity of a B1 magnetic field that may be generated when using a transmit/receive (Tx/Rx) RF coil.

FIG. 2 is a diagram for describing inhomogeneity of a B1 magnetic field that may be generated when using a transmit/receive (Tx/Rx) RF coil 131.

Referring to FIG. 2, the Tx/Rx RF coil 131 generates a B1+ magnetic field 201 in a z-axial direction during a Tx mode and generates a B1− magnetic field 202 in the z-axial direction during an Rx mode.

Since the location of the Tx/Rx RF coil 131 is fixed, when a B1+ magnetic field 201 and a B− magnetic field 202 with respect to the object are generated, a peak point of the B1+ magnetic field 201 for transmitting an RF signal to the object during the Tx mode is different from a peak point of the B1− magnetic field 202 for receiving an RF signal from the object during the Rx mode. In particular, such a phenomenon may be noticeable when an ultra-high magnetic field having a magnetic flux density of 7 T or greater is generated as described above. That is, the peak point of the B1+ magnetic field 201 and the peak point of the B1− magnetic field 202 may be spaced apart from each other by a distance of L on the xy plane.

Thus, since the RF signal transmitted to the object by the B1+ magnetic field 201 and the RF signal received from the object by the B1− magnetic field 202 are not homogeneous, a magnetic resonance image with respect to the object is not accurate, and thus a distorted magnetic resonance image may be acquired. Particularly, when a region of interest of the object is located between the peak point of the B1+ magnetic field 201 and the peak point of the B1− magnetic field 202, the degree of distortion may be increased.

Figure 3:
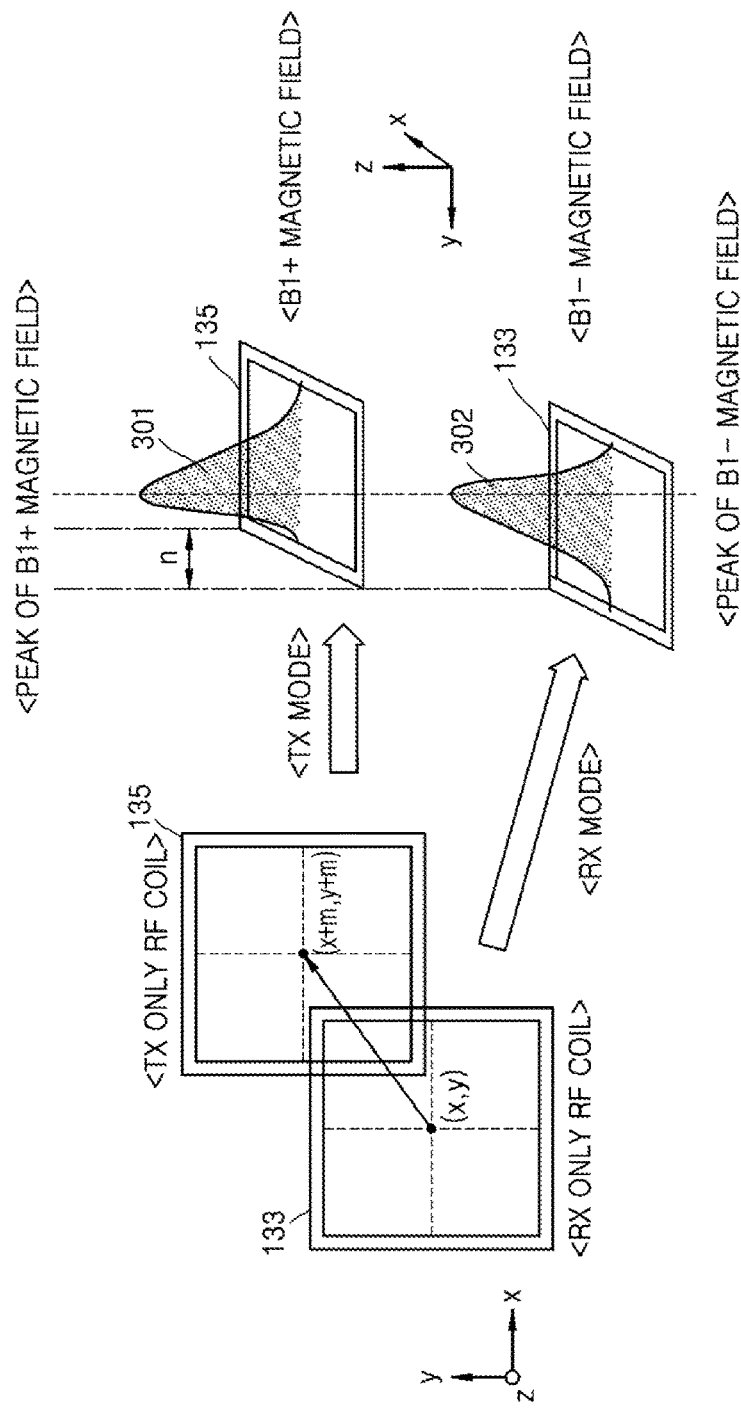
FIG. 3 is a diagram for describing a structure of an RF coil assembly according to an embodiment of the present invention.

FIG. 3 is a diagram for describing a structure of an RF coil assembly 130 according to an embodiment of the present invention.

Referring to FIG. 3, the RF coil assembly 130 according to the present embodiment is different from the Tx/Rx RF coil 131 described above with reference to FIG. 2 in that the RF coil assembly 130 separately includes a transmit only (Tx only) RF coil 135 and a receive only (Rx only) RF coil 133, which are spaced apart from each other by a predetermined distance on a two-dimensional plane.

When the RF coil assembly 130 operates in the Tx mode, only the Tx only RF coil 135 is driven, thereby generating a B1+ magnetic field 301. When the RF coil assembly 130 operates in the Rx mode, only the Rx only RF coil 133 is driven, thereby generating a B1− magnetic field 302.

Differently from the embodiment described above with reference to FIG. 2, the Tx only RF coil 135 and the Rx only RF coil 133 may be located such that the centers thereof are spaced apart from each other by a predetermined distance n on the xy plane that is a two-dimensional plane. That is, if coordinates of the center of the Rx only RF coil 133 are (x, y), coordinates of the center of the Tx only RF coil 135 may be (x+m, y+m).

Here, the distance n between the center of the Tx only RF coil 135 and the center of the Rx only RF coil 133 may be proportional to the distance L between the peak point of the B1+ magnetic field 201 and the peak point of the B1− magnetic field 202 described above with reference to FIG. 2.

Thus, the peak point of the B1+ magnetic field 301 for transmitting the RF signal to the object during the Tx mode may be identical to the peak point of the B1− magnetic field 302 for receiving the RF signal from the object during the Rx mode. Accordingly, the region of interest of the object is located in an area where the intensities of the B1+ magnetic field 301 and the B1− magnetic field 302 are the highest, and thus the most accurate magnetic resonance signal with respect to the region of interest of the object may be received. That is, since homogeneity of the B1 magnetic field is improved, a homogeneous magnetic resonance image may be acquired.

Figure 4:
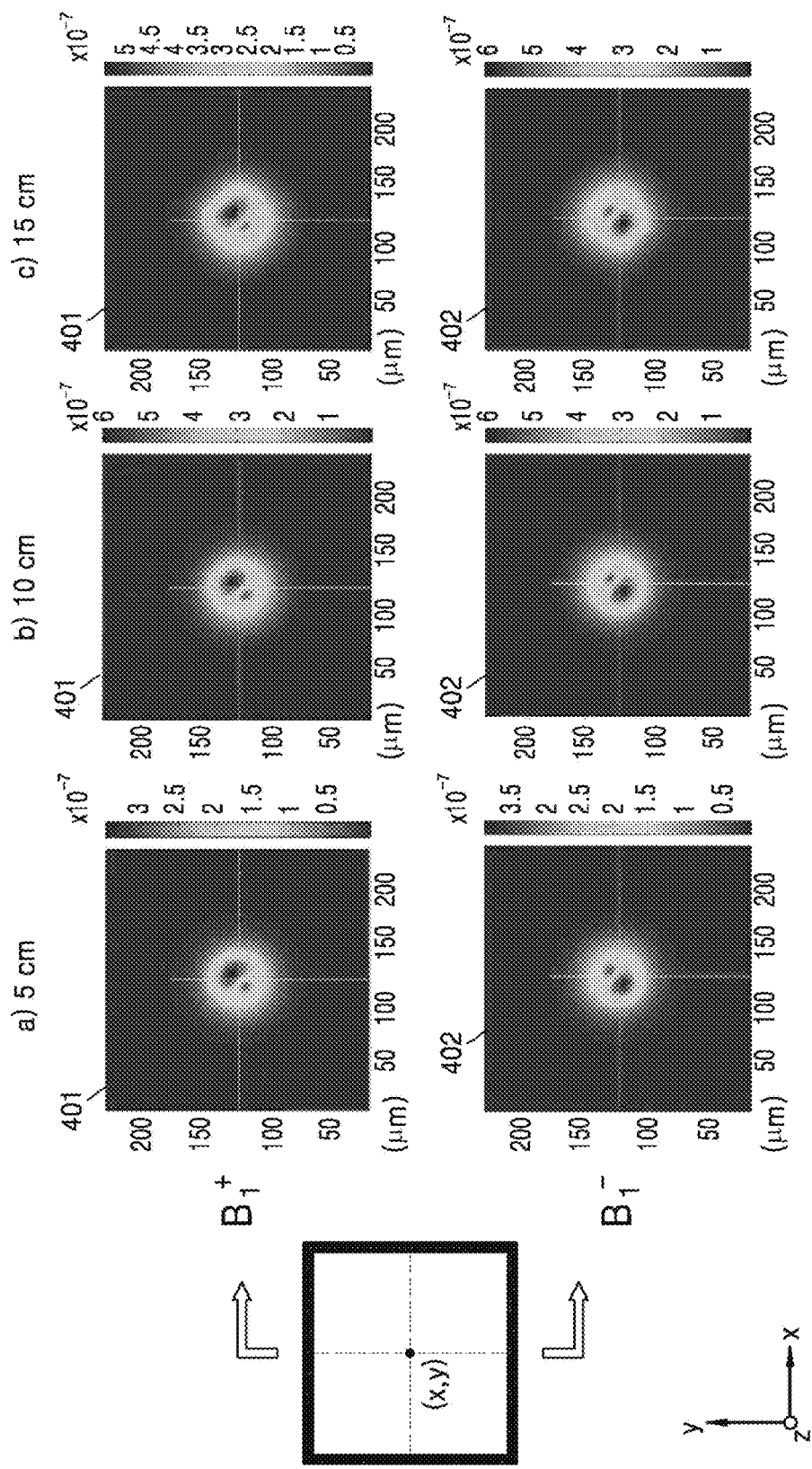
FIG. 4 is a diagram for describing inhomogeneity of a B1 magnetic field that may result regardless of a size of a Tx/Rx RF coil when using the Tx/Rx RF coil.

FIG. 4 is a diagram for describing inhomogeneity of a B1 magnetic field that may be caused regardless of a size of a Tx/Rx RF coil when using the Tx/Rx RF coil.

Referring to FIG. 4, the Tx/Rx RF coil 131 may be implemented to have various sizes. That is, the Tx/Rx RF coil 131 may be fabricated such that one side has a length of 5 cm, 10 cm, or 15 cm.

However, even when the size of the Tx/Rx RF coil 131 is changed, a location of a peak point 401 in a cross-section of the B1+ magnetic field generated by the Tx/Rx RF coil 131 may be different from a location of a peak point 402 in the same cross-section of the B1− magnetic field on the xy plane. That is, when an ultra-high magnetic field having a magnetic flux density of 7 T or greater is generated, the peak point of the B1+ magnetic field may be different from the peak point of the B1− magnetic field. Accordingly, the location of the region of interest of the object represented by the transmitted RF signal may be different from the location of the region of interest of the object represented by the received RF signal, such that it is difficult to acquire a magnetic resonance image of a desired region of interest.

Figure 5:
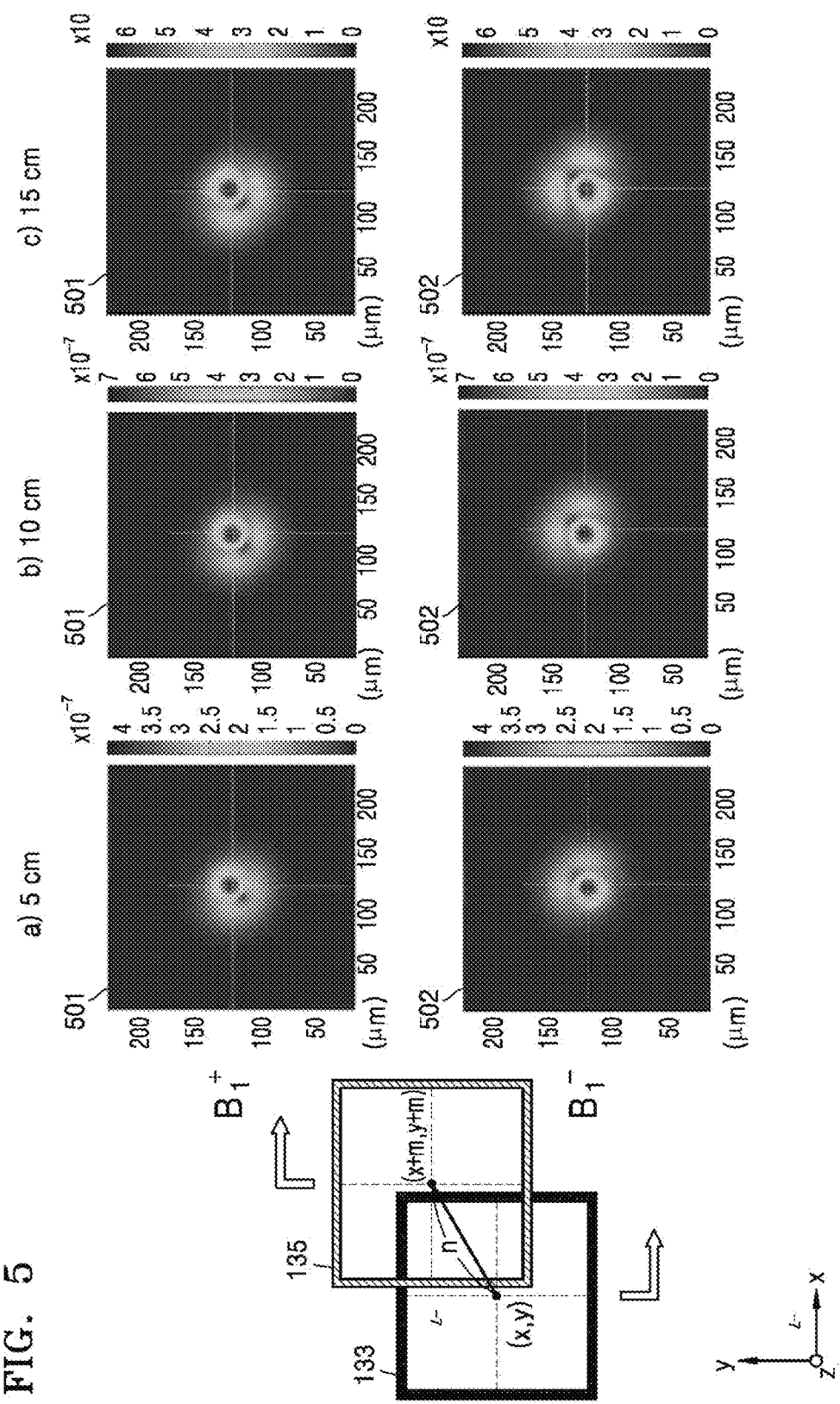
FIG. 5 is a diagram for describing a peak point of a B1+ magnetic field generated by a transmit only (Tx only) RF coil and a peak point of a B1− magnetic field generated by a receive only (Rx only) Rf coil according to an embodiment of the present invention.

FIG. 5 is a diagram for describing a peak point of a B1+ magnetic field generated by a Tx only RF coil and a peak point of a B1− magnetic field generated by an Rx only Rf coil according to an embodiment of the present invention.

Referring to FIG. 5, a location of a peak point 501 in a cross-section of the B1+ magnetic field generated by the Tx only RF coil 135 may be identical to a location of a peak point 502 in a corresponding cross-section of the B1− magnetic field generated by the Rx only RF coil 133. That is, since the Tx only RF coil 135 is spaced apart from the Rx only RF coil 133 such that the centers thereof are spaced apart from each other by a predetermined distance n on the two-dimensional xy plane, the locations of the peak points 501 and 502 having the greatest intensities of the RF signals in the B1 magnetic field are identical to each other, which is different than the case of FIG. 4.

Figure 6:
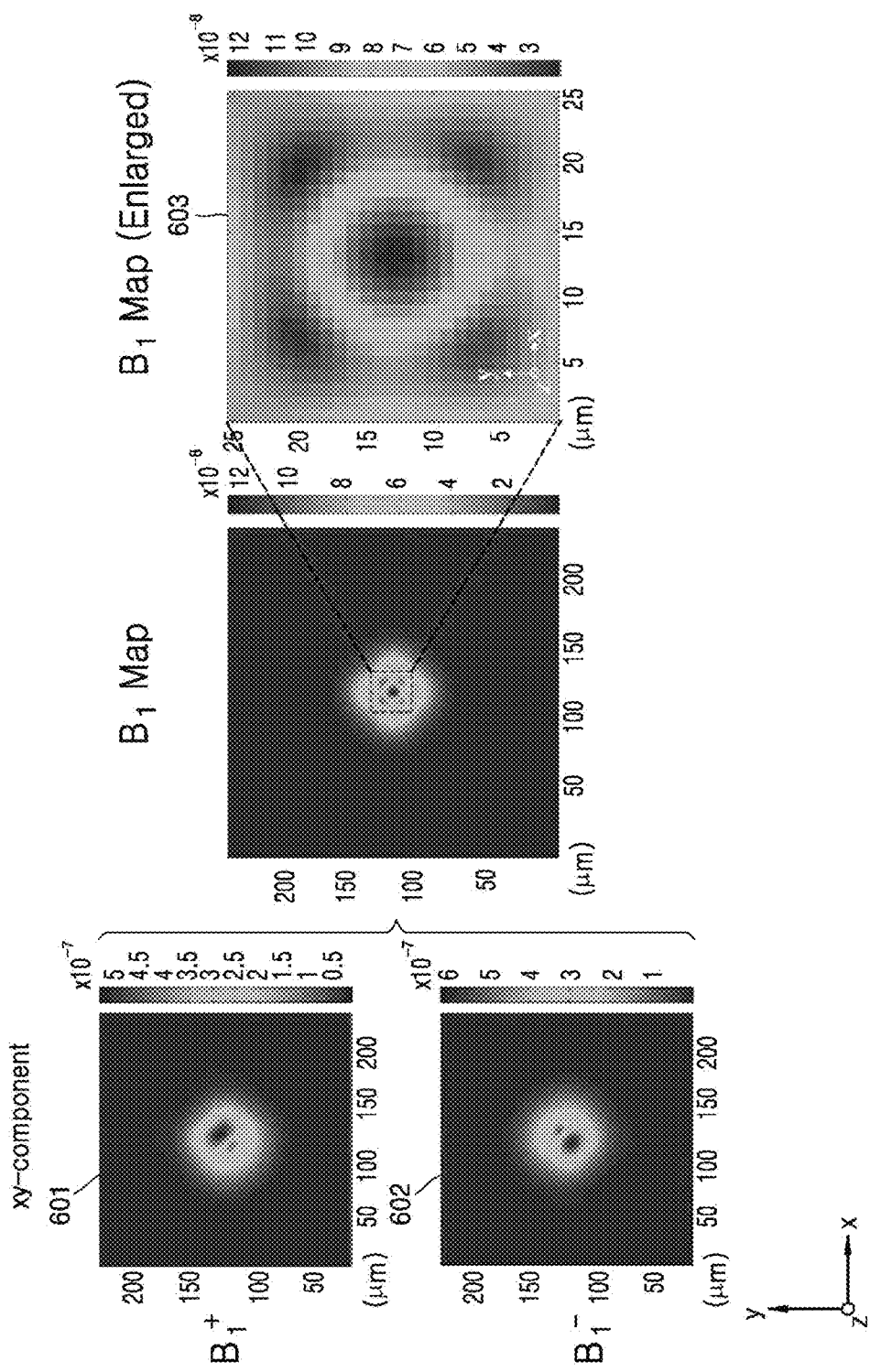
FIG. 6 is a diagram illustrating pixels indicating intensities of RF signals observed at a center of a B1 magnetic field when using a Tx/Rx RF coil.

FIG. 6 is a diagram illustrating pixels indicating intensities of RF signals observed at a center of a B1 magnetic field when using a Tx/Rx RF coil.

Referring to FIG. 6, when the Tx/Rx RF coil is used to generate the ultra-high magnetic field having a magnetic flux density of 7 T or greater, a peak point 601 of the B1+ magnetic field is spaced apart from a peak point 602 of the B1− magnetic field. Thus, in an enlarged image 603, in which a central region of the B1 magnetic field obtained by overlapping the B1+ magnetic field and the B1− magnetic field is enlarged, high intensities of the RF signals indicated by the pixels are not concentrated in one area, but rather are spread out in all directions. Thus, when a region of interest of the object is located between the peak point 601 and the peak point 602, it may be difficult to acquire an accurate magnetic resonance image.

Figure 7:
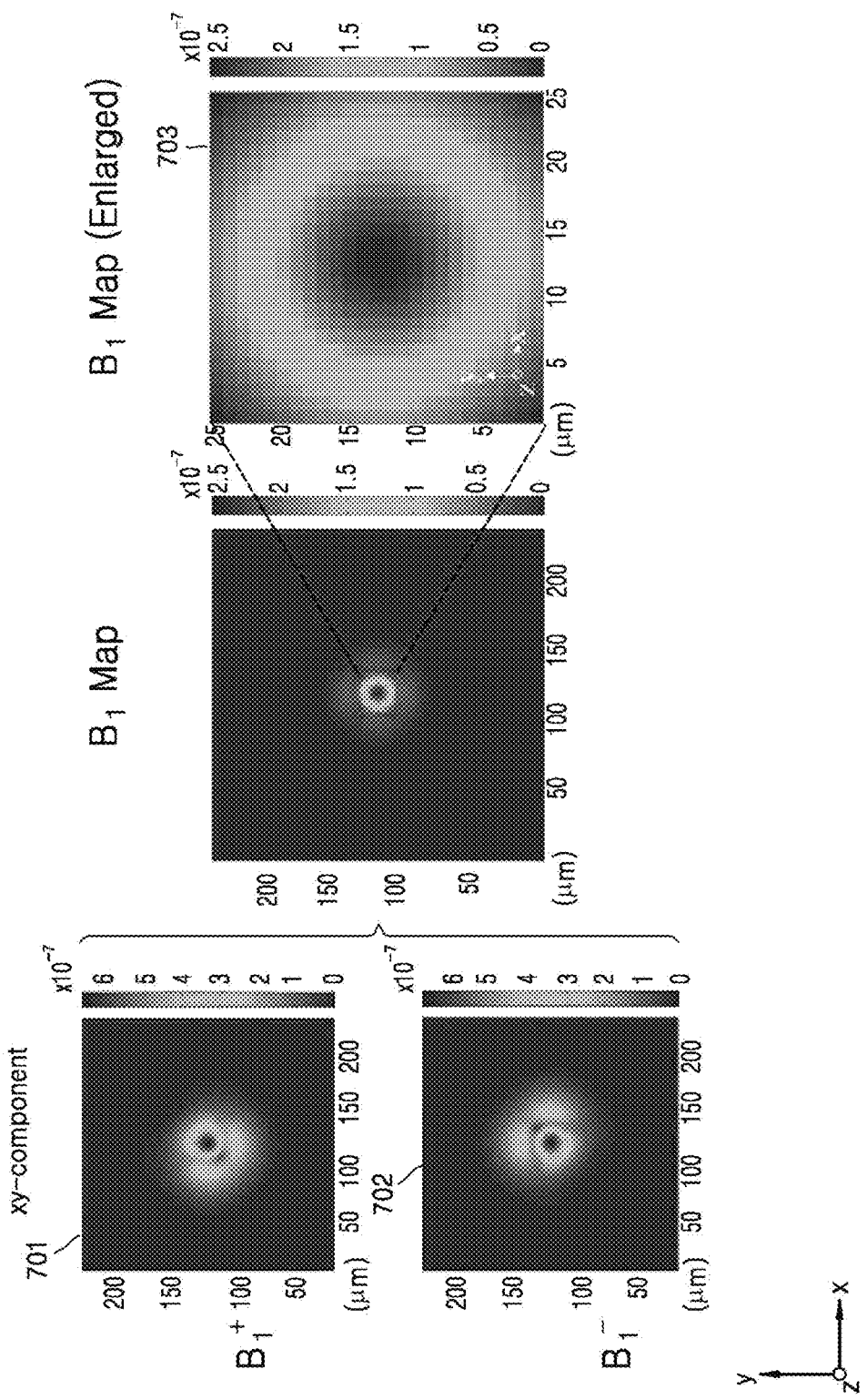
FIG. 7 is a diagram illustrating pixels indicating intensities of RF signals observed at a center of a B1 magnetic field when a Tx only RF coil and an Rx only RF coil are disposed to be spaced apart from each other by a predetermined distance.

FIG. 7 is a diagram illustrating pixels indicating intensities of RF signals observed at a center of a B1 magnetic field when a Tx only RF coil 135 and an Rx only RF coil 133 are disposed to be spaced apart from each other by a predetermined distance.

Referring to FIG. 7, differently from FIG. 6, a peak point 701 of the B1+ magnetic field is identical to a peak point 702 of the B1− magnetic field. Thus, in an enlarged image 703, in which a central region of the B1 magnetic field obtained by overlapping the B1+ magnetic field and the B1− magnetic field is enlarged, high intensities of the RF signals indicated by the pixels are concentrated in one area. Thus, when a region of interest of the object is located between the peak points 701 and 702 where the B1+ magnetic field and the B1− magnetic field have the highest intensities, the most accurate magnetic resonance signal of the region of interest of the object may be acquired.

Meanwhile, as described above with reference to FIG. 2, 4, or 6, the B1 magnetic field generated when using the Tx/Rx RF coil may be calculated by using Equation 1 below.

$$B_{1xy}(x,y) = \sqrt{B_{1x}^{+}(x,y)^2 + j(B_{1y}^{-}(x,y))^2} \qquad \text{[Math Figure 1]}$$

However, since $B_{1x}^{+}(x,y)$, which is an intensity of the B1+ magnetic field during the Tx mode, and $B_{1y}^{-}(x,y)$, which is an intensity of the B1− magnetic field during the Rx mode, have peaks at different points in the ultra-high magnetic field having a magnetic flux density of 7 T or greater, $B_{1xy}(x,y)$, which is an intensity of the B1 magnetic field, is lower when the B1+ magnetic field and the B1− magnetic field are not homogeneous than when the B1+ magnetic field and the B1− magnetic field are homogeneous.

However, when the Rx only coil 133 is spaced apart from the Tx only coil 135 by a distance n such that coordinates of the center of the Rx only RF coil 133 are (x, y), and coordinates of the center of the Tx only RF coil 135 are (x+m, y+m) according to the present embodiment, the B1 magnetic field may be calculated by using Equation 2 below.

$$B_{1xy}(x+m,y+m) = \sqrt{B_{1x}^{+}(x+m,y)^2 + j(B_{1y}^{-}(x,y+m))^2}$$ [Math Figure 2]

Referring to Equation 2, since the Rx only RF coil 133 is spaced apart from the Tx only RF coil 135 by a distance n such that the peak points of the RF signals thereof are identical to each other when the magnetic resonance imaging system 10 is operated at the ultra-high magnetic field having a magnetic flux density of 7 T or greater, $B_{1xy}$(x+m, y+m), which is an intensity of the B1 magnetic field, may be higher than $B_{1xy}$(x,y), which is the intensity of the B1 magnetic field according to Equation 1.

This indicates that the peak point (501 of FIG. 5 or 701 of FIG. 7) of the B1+ magnetic field is identical to the peak point (502 of FIG. 2 or 702 of FIG. 7) of the B1− magnetic field, and a homogenous B1 magnetic field may be generated.

Here, m of Equation 2 and the distance n are respectively integers. In addition, Equation 2 may be changed such that a distance from the x-axis to an x- coordinate may be different from a distance from the y-axis to a y-coordinate.

Figure 8:
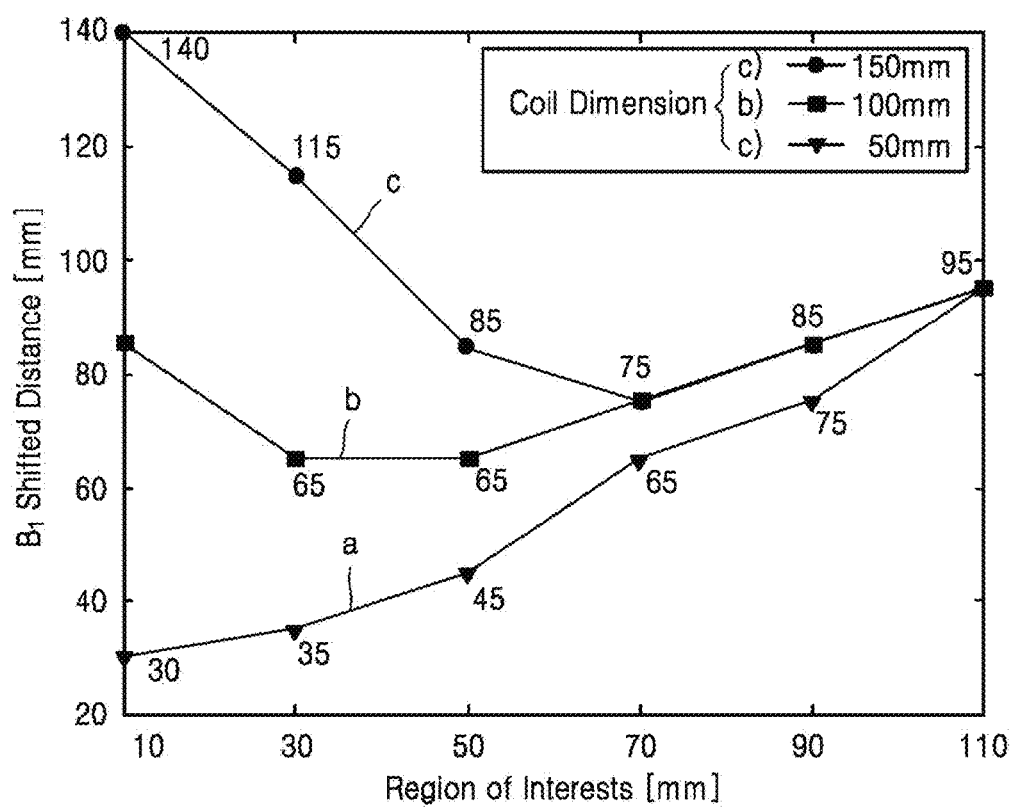
FIG. 8 is a graph illustrating relationship between a distance between an Rx only RF coil and a Tx only RF coil and a size of a region of interest of the object according to an embodiment of the present invention.

FIG. 8 is a graph illustrating a relationship between a distance between an Rx only RF coil and a Tx only RF coil and a size of a region of interest of the object according to an embodiment of the present invention.

The graph of FIG. 8 indicates that the distance n between the Rx only RF coil 133 and the Tx only RF coil 135 may vary according to the size of the region of interest of the object. The graph of FIG. 8 also indicates that the distance n between the Rx only RF coil 133 and the Tx only RF coil 135 may vary according to the size of each of the Rx only RF coil 133 and the Tx only RF coil 135 even when the sizes of the regions of interest are the same.

Thus, the distance n between the Rx only RF coil 133 and the Tx only RF coil 135 may be proportional to the distance between the peak point of the B1+ magnetic field and the peak point of the B1− magnetic field. Also, the distance n between the Rx only RF coil 133 and the Tx only RF coil 135 may depend on the size of each of the Rx only RF coil 133 and the Tx only RF coil 135 and the size of the region of interest of the object.

Figure 9:
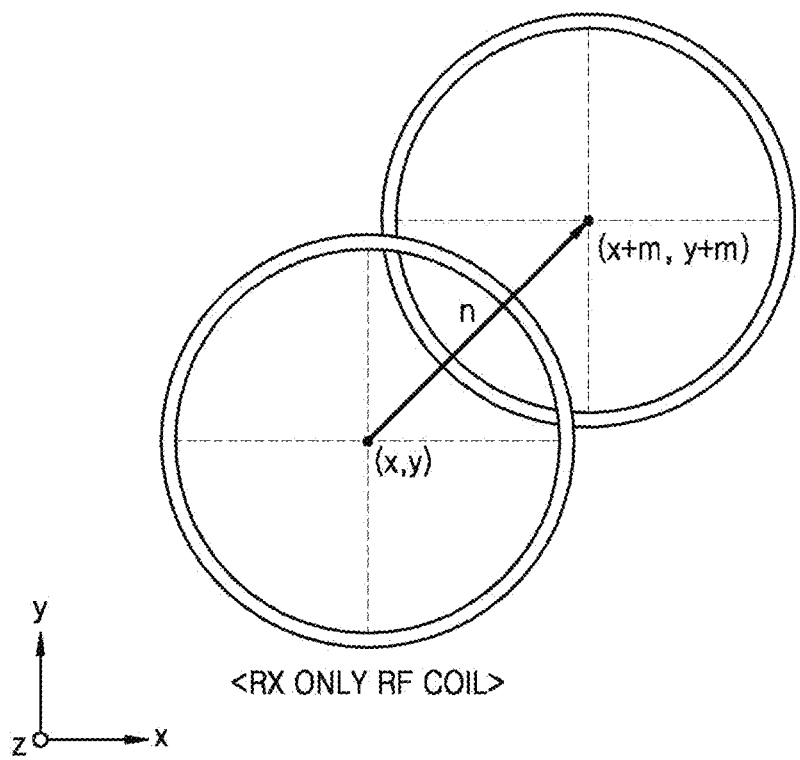
FIG. 9 is a diagram of an RF coil assembly including a circular Tx only RF coil and a circular Rx only RF coil.

FIG. 9 is a diagram of an RF coil assembly including a circular Tx only RF coil and a circular Rx only RF coil.

Referring to FIG. 9, the RF coil assembly 130 may have a circular shape instead of the rectangular coil shape described above. In addition, the Rx only RF coil and the Tx only RF coil may be spaced apart from each other by a distance n such that a peak point of the B1+ magnetic field and a peak point of the B1− magnetic field respectively generated by the Rx only RF coil and the Tx only RF coil are identical to each other.

Figure 10:
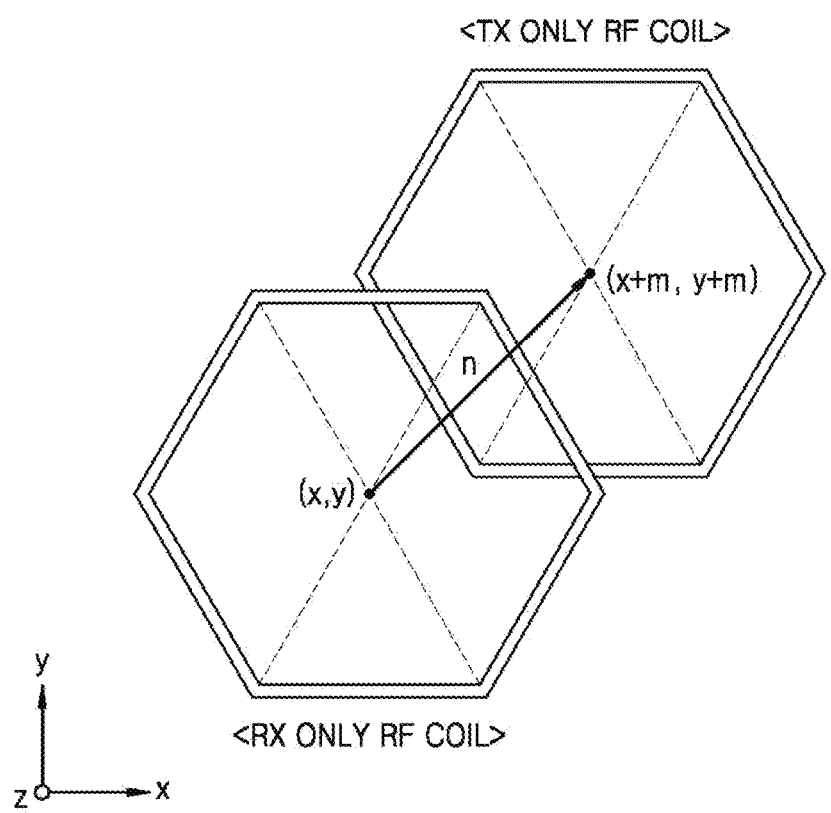
FIG. 10 is a diagram of an RF coil assembly including a hexagonal Tx only RF coil and a hexagonal Rx only RF coil.

FIG. 10 is a diagram of an RF coil assembly including a hexagonal Tx only RF coil and a hexagonal Rx only RF coil.

Referring to FIG. 10, the RF coil assembly 130 may have a hexagonal shape instead of the rectangular coil shape and the circular coil shape described above. In addition, the Rx only RF coil and the Tx only RF coil may be spaced apart from each other by a distance n such that a peak point of the B1+ magnetic field and a peak point of the B1− magnetic field respectively generated by the Rx only RF coil and the Tx only RF coil are identical to each other.

That is, the RF coil assembly 130 according to the present embodiment may include a circular or polygonal RF coil.

As described above, according to the one or more of the above embodiments of the present invention, the Tx only RF coil and the Rx only RF coil are physically and spatially separate from each other, and thus the peak point of the B1+ magnetic field generated by the Tx only RF coil is disposed at a location identical to that of the peak point of the B1− magnetic field generated by the Rx only RF coil. Thus, homogeneity of the B1 magnetic field may be improved and an accurate magnetic resonance image may be acquired.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

The invention claimed is:

1. A radio frequency (RF) coil assembly for magnetic resonance imaging comprising:
   a transmit only (Tx only) RF coil configured to apply an RF signal to an object; and
   a receive only (Rx only) RF coil configured to receive a magnetic resonance signal from a region of interest of the object excited by the RF signal,
   wherein the Tx only RF coil and the Rx only RF coil are disposed such that a center (first center) of the Tx only RF coil and a center (second center) of the Rx only RF coil are spaced apart from each other by a distance resulting in a location of a peak point (first peak point) of a magnetic field generated by the Tx only RF coil to be identical to a location of a peak point (second peak point) of a magnetic field generated by the Rx only RF coil.

2. The RF coil assembly of claim 1, wherein the first peak point is a point where an intensity of the magnetic field generated by the Tx only RF coil is highest, the second peak point is a point where an intensity of the magnetic field generated by the Rx only RF coil is highest, and the first peak point and the second peak point are equal in height with respect to a common plane.

3. The RF coil assembly of claim 1, wherein a size of the Tx only RF coil and a size of the Rx only RF coil are different.

4. The RF coil assembly of claim 1, wherein the distance between the first center and the second center depends on at least one of a size of the Tx only RF coil, a size of the Rx only RF coil, and a size of the region of interest of the object.

5. The RF coil assembly of claim 1, wherein the Tx only RF coil and the Rx only RF coil are disposed to two-dimensionally overlap each other.

6. The RF coil assembly of claim 1, wherein the Tx only RF coil and the Rx only RF coil are single-channel or multi-channel RF coils.

7. The RF coil assembly of claim 1, wherein the Tx only RF coil and the Rx only RF coil are circular RF coils or polygonal coils having N sides, wherein N is a natural number of 3 or greater.

8. The RF coil assembly of claim 1, wherein the magnetic field of the Tx only RF coil is a B1+ magnetic field, and the magnetic field of the Rx only RF coil is a B1− magnetic field.

9. The RF coil assembly of claim 1, wherein the Tx only RF coil and the Rx only RF coil are driven in a magnetic resonance imaging system at a magnetic flux density of 7 tesla (T) or greater.

10. The RF coil assembly of claim 1, wherein the distance is identical to a distance, from a perspective of the Tx only RF coil and the Rx only RF coil being at a same location, between a first peak point of a B1+ magnetic field of the Tx only RF coil and a second peak point of a B1− magnetic field of the Rx only RF coil, or between a third peak point of a B1− magnetic field of the Tx only RF coil and a fourth peak point of a B1+ magnetic field of the Rx only RF coil.

11. The RF coil assembly of claim 10, wherein, with the Tx only RF coil and the Rx only RF coil being disposed at the spaced apart locations, the peak point of the magnetic field generated by the Tx only RF coil is a point where an intensity of the magnetic field generated by the Tx only RF coil is highest, the peak point of the magnetic field generated by the Rx only RF coil is a point where an intensity of the magnetic field generated by the Rx only RF coil is highest, and the peak point of the magnetic field generated by the Tx only RF coil and the peak point of the magnetic field generated by the Rx only RF coil are equal in height with respect to a common plane.

12. A magnetic resonance imaging system comprising:
    a radio frequency (RF) coil assembly comprising a transmit only (Tx only) RF coil configured to apply an RF signal to an object and a receive only (Rx only) RF coil configured to receive a magnetic resonance signal from a region of interest of the object excited by the RF signal;
    an RF coil controller which controls an RF transmission mode of the Tx only RF coil and an RF reception mode of the Rx only RF coil; and
    an image processor which generates a magnetic resonance image of the object based on the received magnetic resonance signal,
    wherein the Tx only RF coil and the Rx only RF coil are disposed such that a center (first center) of the Tx only RF coil and a center (second center) of the Rx only RF coil are spaced apart from each other by a distance resulting in a location of a peak point (first peak point) of a magnetic field generated by the Tx only RF coil to be identical to a location of a peak point (second peak point) of a magnetic field generated by the Rx only RF coil.

13. The magnetic resonance imaging system of claim 12, wherein the first peak point is a point where an intensity of the magnetic field generated by the Tx only RF coil is highest, the second peak point is a point where an intensity of the magnetic field generated by the Rx only RF coil is highest, and the first peak point and the second peak point are equal in height with respect to a common plane.

14. The magnetic resonance imaging system of claim 12, wherein a size of the Tx only RF coil and a size of the Rx only RF coil are different.

15. The magnetic resonance imaging system of claim 12, wherein the distance between the first center and the second center depends on at least one of a size of the Tx only RF coil, a size of the Rx only RF coil, and a size of the region of interest of the object.

16. The magnetic resonance imaging system of claim 12, wherein the Tx only RF coil and the Rx only RF coil are disposed to two-dimensionally overlap each other.

17. The magnetic resonance imaging system of claim 12, wherein the Tx only RF coil and the Rx only RF coil are single-channel or multi-channel RF coils.

18. The magnetic resonance imaging system of claim 12, wherein the Tx only RF coil and the Rx only RF coil are circular RF coils or polygonal coils having N sides, wherein N is a natural number of 3 or greater.

19. The magnetic resonance imaging system of claim 12, wherein the magnetic field of the Tx only RF coil is a B1+ magnetic field, and the magnetic field of the Rx only RF coil is a B1− magnetic field.

20. The magnetic resonance imaging system of claim 12, wherein the magnetic resonance imaging system is driven at a magnetic flux density of 7 tesla (T) or greater.

\* \* \* \* \*